(12) United States Patent
Wohlfahrt

(10) Patent No.: US 6,720,598 B1
(45) Date of Patent: Apr. 13, 2004

(54) SERIES MEMORY ARCHITECTURE

(75) Inventor: Joerg Wohlfahrt, Kanagawa-ken (JP)

(73) Assignee: Infineon Technologies Aktiengesellschaft, Munich (DE)

( * ) Notice: Subject to any disclaimer, the term of this patent is extended or adjusted under 35 U.S.C. 154(b) by 0 days.

(21) Appl. No.: 10/065,124

(22) Filed: Sep. 19, 2002

(51) Int. Cl.$^7$ .............................................. H01L 29/76
(52) U.S. Cl. ...................... 257/295; 257/296; 257/298; 257/300; 257/303; 438/3; 438/250; 438/393
(58) Field of Search ................................ 257/295–314, 257/68, 71, 324–326, 905–908; 438/3, 241–244, 258, 266, 238, 239, 386, 399, 250, 216, 261, 393, 591, 593

(56) References Cited

U.S. PATENT DOCUMENTS 5,903,492 A * 5/1999 Takashima ............ 257/E27.104
2002/0075736 A1 * 6/2002 Kumura et al. ...... 257/E27.104

* cited by examiner

Primary Examiner—Son L. Mai
Assistant Examiner—Andy Huynh
(74) Attorney, Agent, or Firm—Horizon IP Pte Ltd

(57) ABSTRACT

An IC with a memory array having a series architecture is disclosed. The memory cells of the series group are arranged in pairs in which the capacitors of a memory cell pair are stacked one on top of the other. This advantageously allows for larger capacitor arrays without increasing the chip size.

10 Claims, 8 Drawing Sheets

SERIES MEMORY ARCHITECTURE

BACKGROUND OF INVENTION

Ferroelectric metal oxide ceramic materials such as lead zirconate titanate (PZT) have been investigated for use in ferroelectric semiconductor memory devices. The ferroelectric material is located between two electrodes to form a ferroelectric capacitor for storage of information. Ferroelectric capacitor uses the hysteresis polarization characteristic of the ferroelectric material for storing information. The logic value stored in a ferroelectric memory cell depends on the polarization direction of the ferroelectric capacitor. To change the polarization direction of the capacitor, a voltage which is greater than the switching voltage (coercive voltage) needs to be applied across its electrodes. The polarization of the capacitor depends on the polarity of the voltage applied. An advantage of the ferroelectric capacitor is that it retains its polarization state after power is removed, resulting in a non-volatile memory cell.

Referring to FIG. 1, a group 102 of memory cells 105 is shown. The memory cells, each with a transistor 130 coupled to a capacitor 140 in parallel, are coupled in series. Such series memory architectures are described in, for example, Takashima et al., "High Density Chain Ferroelectric Random Access Memory (chain FRAM)", IEEE Jrnl. of Solid State Circuits, vol.33, pp.787–792, May 1998, which is herein incorporated by reference for all purposes. The gates of the cell transistors can be gate conductors which are coupled to or serve as wordlines. A selection transistor 138 is provided to selectively couple one end 109 of the group to a bitline 150. A plateline 180 is coupled to the other end 108 of the group. Numerous groups are interconnected via wordlines to form a memory block. Sense amplifiers are coupled to the bitlines to facilitate access to the memory cells. FIG. 2 shows a cross-section of a conventional memory group 202. The transistors 230 of the memory cells 205 are formed on a substrate 210. Adjacent cell transistors share a common diffusion region. The capacitors 240 of the memory group are arranged in pairs. The capacitors of a capacitor pair share a common bottom electrode 241. The bottom electrodes are coupled to the cell transistors via active area bottom electrode (AABE) plugs 285. The top electrode 242 of a capacitor from a capacitor pair is coupled to the top electrode of a capacitor from an adjacent capacitor pair and cell transistors. The top capacitor electrodes are coupled to the cell transistors via active area top electrode (AATE) plugs 286. Between the electrodes is a ferroelectric layer 243. A barrier layer 263, such as iridium oxide, is located between the electrode and the AABE plug. At a first end 209 of the group is a selection transistor (not shown) having one diffusion region coupled to a bitline. The other diffusion region is a common diffusion region with the cell transistor on the end of the group. A plateline is coupled to a second end 208 of the group.

The series architecture theoretically enables a $4F_2$ cell size, where F is the feature size. However, conventional series architectures require a sufficient capacitance to produce a sufficient read signal for sensing. To produce the necessary capacitance, a capacitor with relatively large surface area is needed. This undesirably increases the cell size to greater than $4F^2$.

From the foregoing discussion, it is desirable to provide a memory group which avoids the disadvantages of conventional series memory architectures.

SUMMARY OF INVENTION

The invention relates generally to ICs. More particularly, the invention relates to ICs with a plurality of memory cells having a series architecture. The memory cells of the group are arranged into pairs of memory cells. A memory cell pair comprises a first memory cell having a first transistor with a gate and first and second diffusion regions and a first capacitor with first and second plates separated by a first capacitor dielectric and a second memory cell having a transistor with a gate and first and second diffusion regions and a second capacitor with first and second plates separated by a second capacitor dielectric. In one embodiment, the second diffusion regions of the first and second transistors of the memory cell pair, is a common second diffusion region. The first and second capacitors are arranged in a stack in which the second plates of the capacitors form a common second plate. The first plate of the first capacitor is coupled to the first diffusion region of the first transistor, the first plate of the second capacitor is coupled to the first diffusion region of the second transistor, and the common second plate is coupled to the common second diffusion region. In one embodiment, the memory cells are ferroelectric memory cells. By providing a memory cell pair of a series group in which the capacitors are stacked advantageously allows larger capacitors for the memory cells without increasing cell size, for example, beyond $4F^2$.

DETAILED DESCRIPTION

Figure 1:
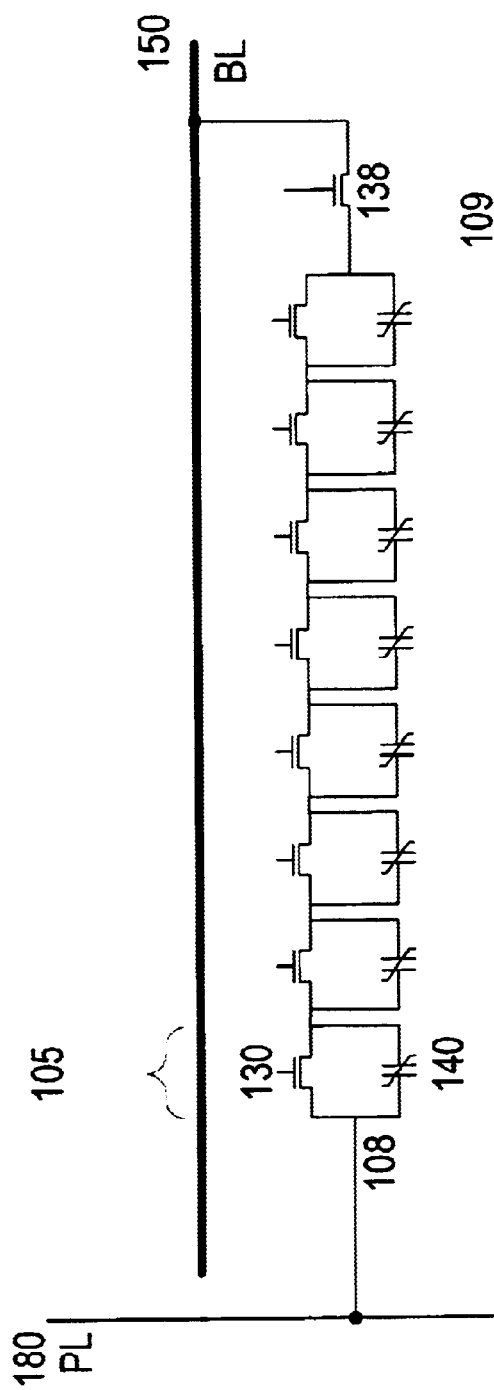
FIG. 1 shows a schematic diagram of a group of conventional ferroelectric memory cells.
Figure 2:
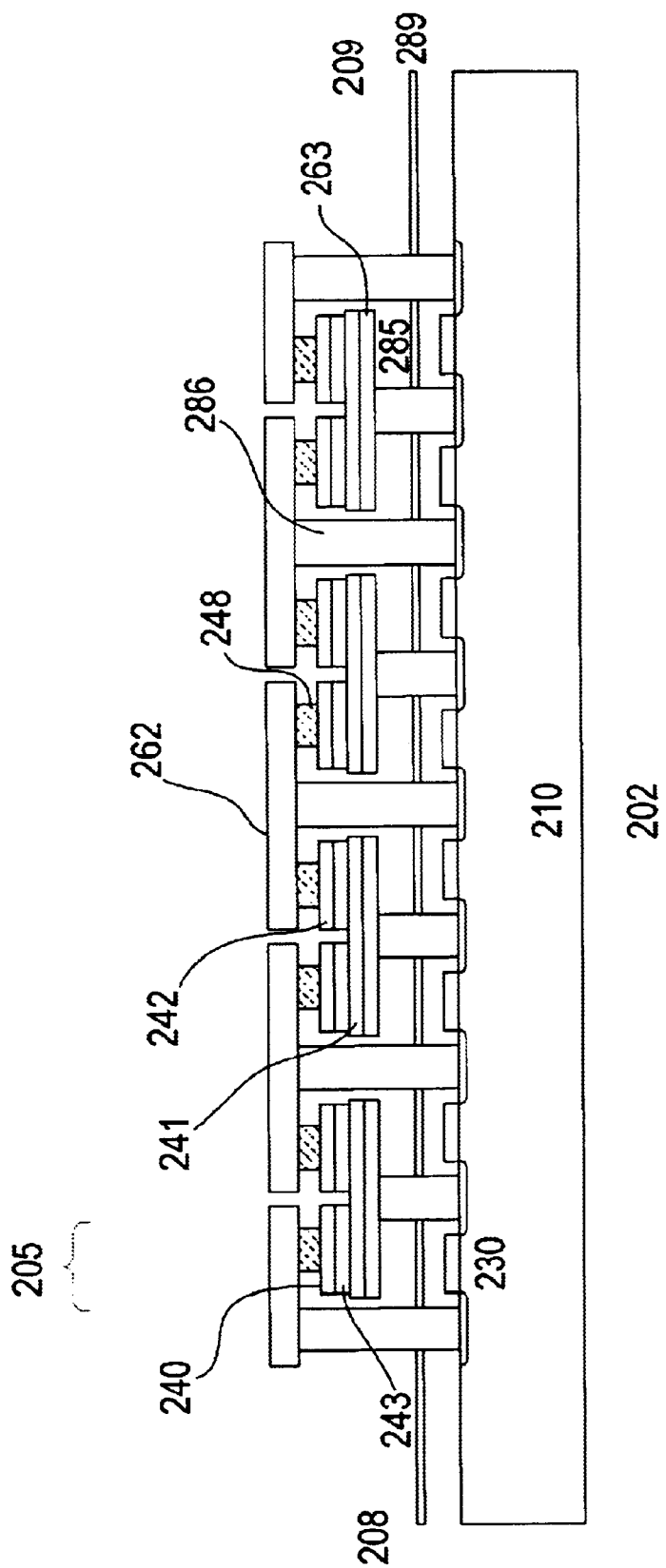
FIG. 2 shows a cross-sectional view of a group of conventional ferroelectric memory cells.
Figure 3:
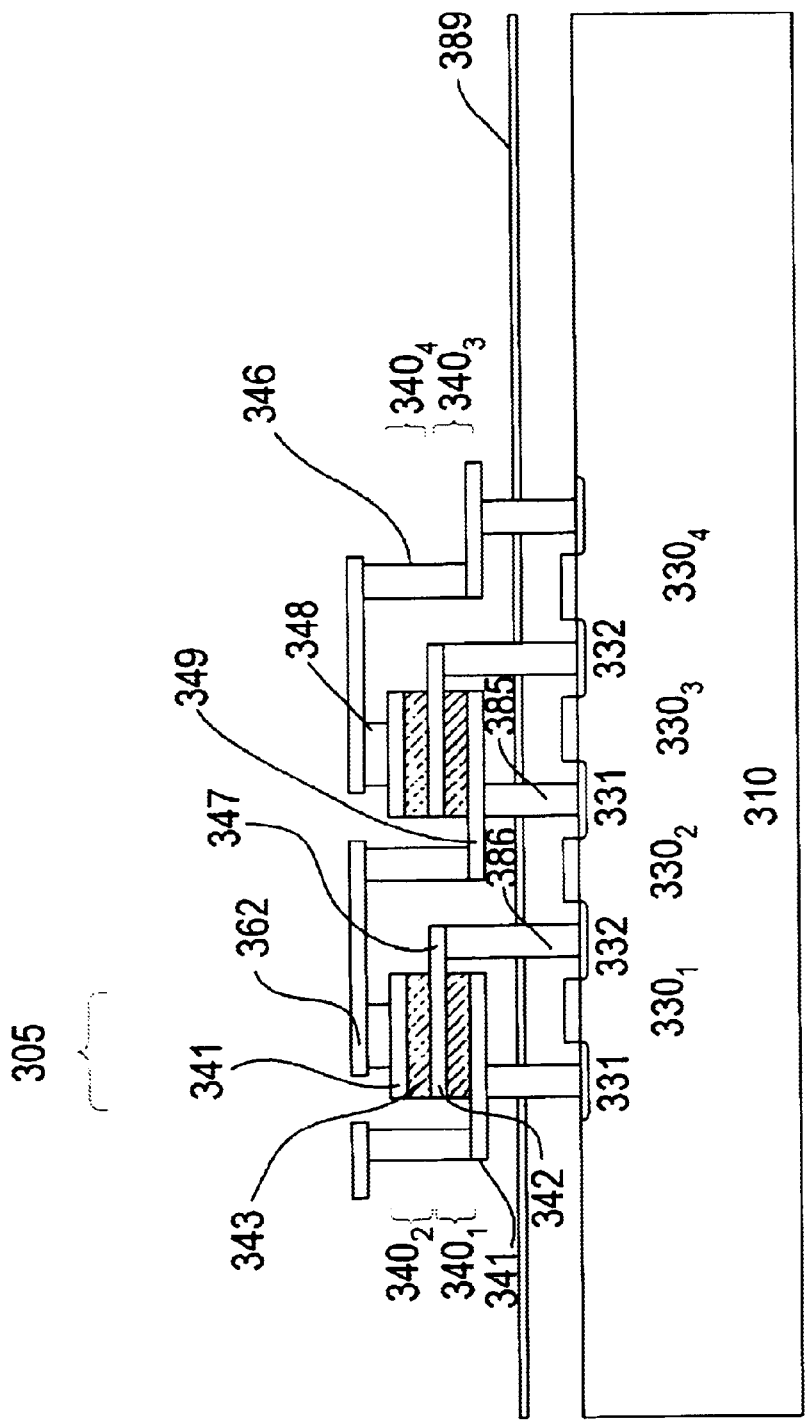
FIG. 3 shows cross-sectional view of a group of memory cells in accordance with various embodiments of the invention.

FIG. 3 shows a cross-sectional view of a portion of a group 302 of memory cells in accordance with one embodiment of the invention. The portion of the group includes a plurality of memory cells 305 formed on a semiconductor substrate 310 comprising, for example, silicon. Illustratively, the portion includes 4 memory cells 305. It is understood that the group can comprise any number of memory cells (e.g., 2, 8 or 16). Preferably, the number of memory cells within a group is an even number. More preferably, the number of memory cells within a group is equal to $2^y$, where y is a whole number greater than or equal to 1. Typically, y is from 2–5.

The memory cells each comprises a cell transistor 330 coupled to a capacitor 340. The transistors, in one embodiment, are n-FETs. P-FETs or other types of transistors can also be used. Each cell transistor includes a gate and first and second diffusion regions 331 and 332. In one embodiment, adjacent cell transistors share a common diffusion region. For a cell transistor which has two (e.g., first and second) adjacent cell transistors, both diffusion regions are shared with adjacent transistors. In one embodiment, adjacent cell transistors share either a common first or second diffusion region. As for the transistors at either end of the group ($330_1$ or $330_4$), only their second diffusion regions are shared with adjacent transistors. For example, the first and second cell transistors $330_1$ and $330_2$ share a common second diffusion region 332 while the second and third cell transistors $330_2$ and $330_3$ share a common first diffusion region 331.

In one embodiment, the capacitors are ferroelectric capacitors. A ferroelectric capacitor includes a ferroelectric layer 343 between first and second electrodes 341 and 342. Conductive materials, such as noble metals, (e.g., platinum) can be used to form the electrodes. Other types of conductive materials, such as conductive oxides (e.g., SRO or IrO), can be used to form the electrodes. It is not necessary that the first and second electrodes be formed from the same type of material. The ferroelectric material, in one embodiment, comprises PZT. Strontium bismuth tantalate (SBT) or other types of ferroelectric material can also be used. In a preferred embodiment, the capacitor comprises platinum electrodes. More preferably, an IrO layer is provided between an electrode and the plug coupled to the diffusion region of a transistor. Alternatively, other types of capacitors can be employed. For example, non-ferroelectric capacitors such as high k dielectric capacitors can be used.

The transistor and capacitor of a memory cell are coupled in parallel. A first electrode 341 of a capacitor is coupled to a first diffusion region and the second electrode 342 is coupled to the second diffusion region.

In accordance with the invention, memory cells of the group are arranged into memory cell pairs, each having a first memory cell with first transistor coupled to a first capacitor and a second memory cell with a second transistor coupled to a second capacitor. The first and second capacitors of the cell pair are stacked. In one embodiment, the capacitor of the first memory cell is located on the bottom while the capacitor of the second memory cell is located on top. The capacitors share a common second electrode, with the bottom capacitor located on the second electrode's bottom surface and the top capacitor on the second electrode's top surface.

In one embodiment, the first electrode of the bottom capacitor is coupled to the first diffusion region of the first transistor. An AABE plug 385, in one embodiment, is provided to couple the first electrode of the bottom capacitor to the first diffusion region of the first transistor. The common second electrode is coupled to second diffusion region which is shared between the first and second transistor. In one embodiment, the common second electrode is coupled to the common second diffusion region of the transistor pair via an active area common electrode (AACE) plug 386. The common second electrode, for example, includes an extension 347 for coupling to the AACE plug. The AACE plug is isolated from the first electrode and dielectric layer to prevent shorting of the capacitor.

In one embodiment, a barrier layer (not shown) is provided between the AABE plugs and bottom electrodes. The barrier layer inhibits the diffusion of oxygen which can oxidize the plug. Materials comprising iridium, such as iridium oxide, can be used to form the barrier layer. Other types of barrier materials which inhibit diffusion of oxygen are also useful. An adhesion layer comprising, for example titanium nitride or titanium, can be provided between the barrier and ILD layer to promote adhesion.

The first electrode of the top capacitor is coupled to the first diffusion region of the second transistor. If the first diffusion region of the second transistor is shared by an adjacent memory cell pair, the first electrode of the top capacitor is coupled to the first electrode of the bottom capacitor of the adjacent memory cell pair. The first electrode of the top capacitor is coupled to the first electrode of the bottom capacitor by, for example, a first capacitor electrode (FCE) plug 346. The first electrode of the bottom capacitor can include an extension 349 for coupling to the FCE plug. To prevent shorting of the capacitor, the FCE plug is isolated from the first electrode and dielectric layer. In one embodiment, the FCE plug is coupled to the top electrode via a top electrode (TE) plug 348 and conductive line 362.

The coupling of the capacitor stack to the AABE can be, for example, offset. As shown, the offset results in the capacitor stack located substantially over one of the transistor gates of the cell pair. The amount of the offset can be selected to optimize the cell size. For example, the offset can depend on the size of the capacitor and amount of extension needed to accommodate the FCE plug.

If the first diffusion region of the first transistor is shared with an adjacent memory cell pair, the first electrode of the bottom capacitor is coupled to the first electrode of the top capacitor of an adjacent memory cell pair, for example, by an FCE plug. Other techniques for coupling the first electrode of the capacitor to the first electrode of the bottom capacitor of an adjacent memory pair are also useful.

An encapsulation layer (not shown) is provided over the capacitors. The encapsulation layer, in one embodiment, comprises aluminum oxide ($Al_2O_3$). Other types of non-conductive barrier materials can also be used. A lower barrier layer 389 can be provided between the gate and capacitor to protect, for example, the gate stack and contact from oxidizing during high temperature processes, such as an oxygen recovery anneal. The lower barrier layer comprises, for example, $Al_2O_3$ or other barrier materials.

If the first diffusion region of the first or second transistor is not shared with an adjacent memory cell pair, then it indicates an end of the memory group. Depending on which end, it may be coupled to a bitline or a plateline. A selection transistor may be provided to selectively couple the chain to the bitline. The selection transistor can share a diffusion region with the cell transistor.

Figure 4:
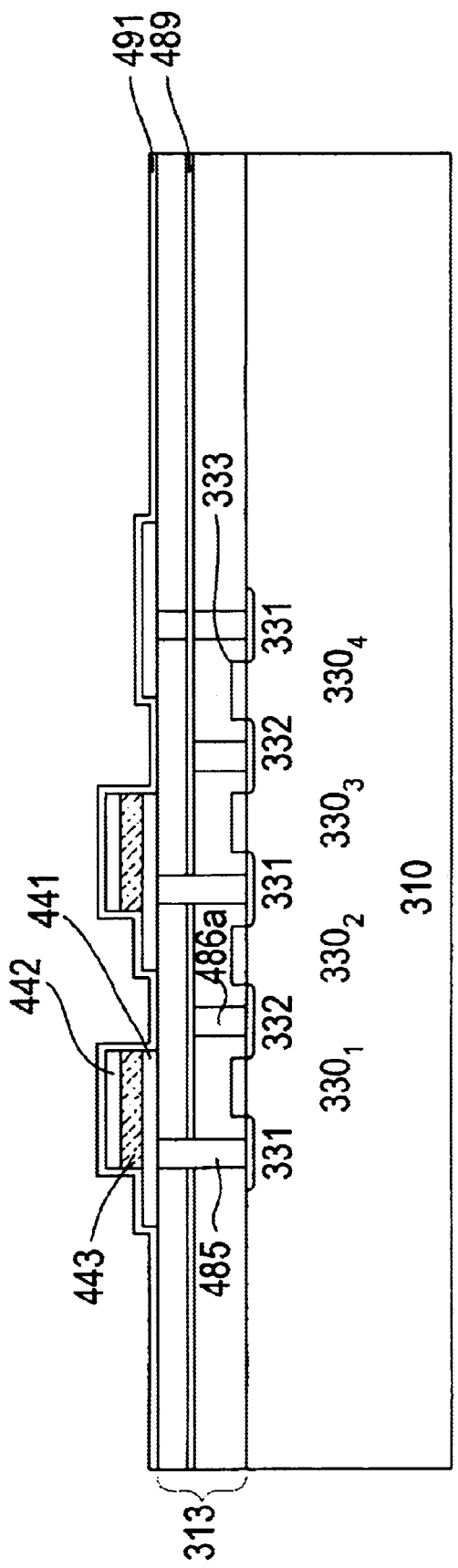
FIGS. 4–8 show a process for forming a group of memory cells in accordance with one embodiment of the invention.

FIGS. 4–8 show a process for forming a memory group in accordance with one embodiment of the invention. Referring to FIG. 4, a semiconductor substrate 310 is provided. The substrate comprises, for example, silicon. Other types of semiconductor substrates are also useful. The substrate is prepared with cell transistors of the memory chain. Other components (not shown), such as support circuitry, can also be prepared on the substrate. Illustratively, the memory group comprises 4 memory cells.

A cell transistor 330 comprises a gate 333 and first and second diffusion regions 331 and 332. In one embodiment, adjacent cell transistors share a common diffusion region (331 or 332). For transistors in the middle of the chain, both diffusion regions are shared with adjacent cell transistors while the cell transistors at the end of the chain each has only one shared diffusion region. The cell transistors, for example, are n-FETs. P-FETS or other types of transistors can also be used. A selection transistor (not shown) can also be provided on the substrate. The selection transistor can share a common diffusion region with a cell transistor on one end of the group.

An ILD layer 313 is provided over the substrate. The ILD, for example, comprises silicon oxide. Other types of dielectric materials, such as silicon nitride, doped or undoped silicate glass, or spin-on glass, are also useful. Various techniques can be used to form the ILD, such as chemical vapor deposition (CVD).

In one embodiment, AACE plugs 486 are formed in two separate processes. The first process forms the lower portions 486a while the second process forms the upper portions. Forming the AACE plugs in two separate processes facilitates filling of the vias since the aspect ratio is reduced. Alternatively, the AACE plugs can be formed in a single process step, for example, after the capacitors are formed.

Lower portions of AACE plugs 486a and AABE plugs 485 are formed in the ILD layer, coupling to the diffusion regions of the cell transistors. In one embodiment, the AABE plugs are coupled to the first diffusion regions 331 while the lower portions of AACE plugs are coupled to the second diffusion regions 332. The plugs, for example, comprise a conductive material such as poly-Si. Other types of conductive material, such as tungsten (W), can also be used.

The plugs are formed using conventional techniques. For example, a resist layer is deposited on the ILD layer and patterned to form openings corresponding to vias in which plugs are formed. An an isotropic etch, such as reactive ion etching (RIE), is then performed. The RIE removes portions of the ILD layer exposed by the resist mask, creating vias. A conductive material is then deposited on the substrate, filling the vias. Excess conductive material over the ILD is then removed by, for example, chemical mechanical polishing (CMP). The CMP creates a planar surface between the plugs and ILD.

A liner layer, such as titanium, can be deposited on the substrate to line the via walls prior to filling the vias. The liner layer can be used for silicidation of the substrate material to reduce contact resistance. A barrier, such as titanium nitride, can also be provided to line the via walls. The barrier layer inhibits reaction between the substrate and plug materials. Depending on whether the liner and/or barrier layers are conductive or not, the bottom of the via may be removed to expose the diffusion region.

In one embodiment, the AABE and lower portions of the AACE plugs are formed by separate processes. The height of the lower portions of the AACE plugs, in one embodiment, is lower than the height of the AABE plugs. This can be achieved by, for example, depositing a first dielectric layer followed by forming the lower portions of the AACE plugs. Thereafter, a second dielectric layer is deposited and the AABE plugs are formed. Forming the plugs separately is particularly advantageous since it allows for the different types of plugs to be optimized. Alternatively, the different types of plugs can have the same height or formed during the same process.

In one embodiment, a lower barrier layer 489 is formed on the dielectric layer after the lower portion of AACE plugs is formed. The barrier layer protects the gate stack and contacts from oxidation from subsequent processes. The barrier layer, for example, comprises aluminum oxide ($Al_2O_3$). Other barrier materials, such as silicon nitride, can also be used.

After the plugs are formed, the process continues to form the first capacitors of the memory cell pairs. In one embodiment, the capacitors are ferroelectric capacitors. In one embodiment, the various layers of the first capacitors are deposited on the substrate. For example, a barrier layer, first electrode, ferroelectric, and common electrode layers 441, 443 and 442 are deposited on the substrate. The electrode layers comprise, for example, platinum and ferroelectric layer comprises PZT. The use of other types of electrode and ferroelectric materials are also useful. In alternative embodiments, the various layers are used to form non-ferroelectric capacitors such as dynamic random access memory (DRAM) capacitors. Conventional techniques, such as CVD, MOCVD, PVD, and spin-on, can be used to form the various capacitor layers.

Prior to forming the first electrode layer, a barrier layer can be deposited on the ILD layer. The barrier layer comprises, for example, iridium oxide. Other materials which can inhibit the diffusion of oxygen can also be used. To promote adhesion between the barrier layer and ILD, an adhesion layer can be provided beneath the barrier layer. The adhesion layer comprises, in one embodiment, titanium. Other types of adhesion promoting materials can also be used, including non-conductive materials. For non-conductive materials, the adhesion layer can remain on the ILD except wherein the plugs are located. Various techniques, for example PVD and CVD, can be used to form the barrier and adhesion layers.

For applications where the plug comprises poly-Si, a metal suicide layer can be formed over the ILD prior to the capacitor layers. The metal silicide, for example comprises titanium or cobalt. Other metal silicides are also useful. The metal silicide can be formed by conventional techniques.

In one embodiment of the invention, the first capacitor layers are patterned in two separate processes. The first process patterns the ferroelectric and common electrode layers, forming the upper portion of the first sub-capacitors. The second process patterns the first electrode layer. Conventional mask and etch techniques can be used to pattern the layers. For example, a hard mask is deposited on the top capacitor layer. The hard mask, in one embodiment, comprises $SiO_2$. Other hard mask material is also useful. A photoresist layer is deposited on the hard mask layer. An antireflective (ARC) layer can be formed beneath the photoresist. The photoresist layer is patterned, leaving a resist block to protect the hard mask layer in regions corresponding to the area of the capacitor. An anisotropic etch, such as an RIE, is used to remove the exposed portions of the hard mask layer to expose the top capacitor layer. The resist is removed after the hard mask is patterned. An RIE is then performed to remove the layers beneath.

In an alternative embodiment, the first capacitors can be formed by depositing and patterning the first electrode layer (including layers beneath such as the barrier and adhesion layers, if present), and then depositing and patterning the ferroelectric and common electrode layers. Other techniques for forming the first capacitors are also useful.

After the capacitors are formed, an encapsulation layer 491 is deposited on the substrate. The encapsulation layer covers the capacitors and ILD layer. In one embodiment the encapsulation layer comprises $Al_3O_2$. Other types of materials which are good insulators and have good barrier properties, such as SiN or $TiO_2$ are also useful.

Figure 5:
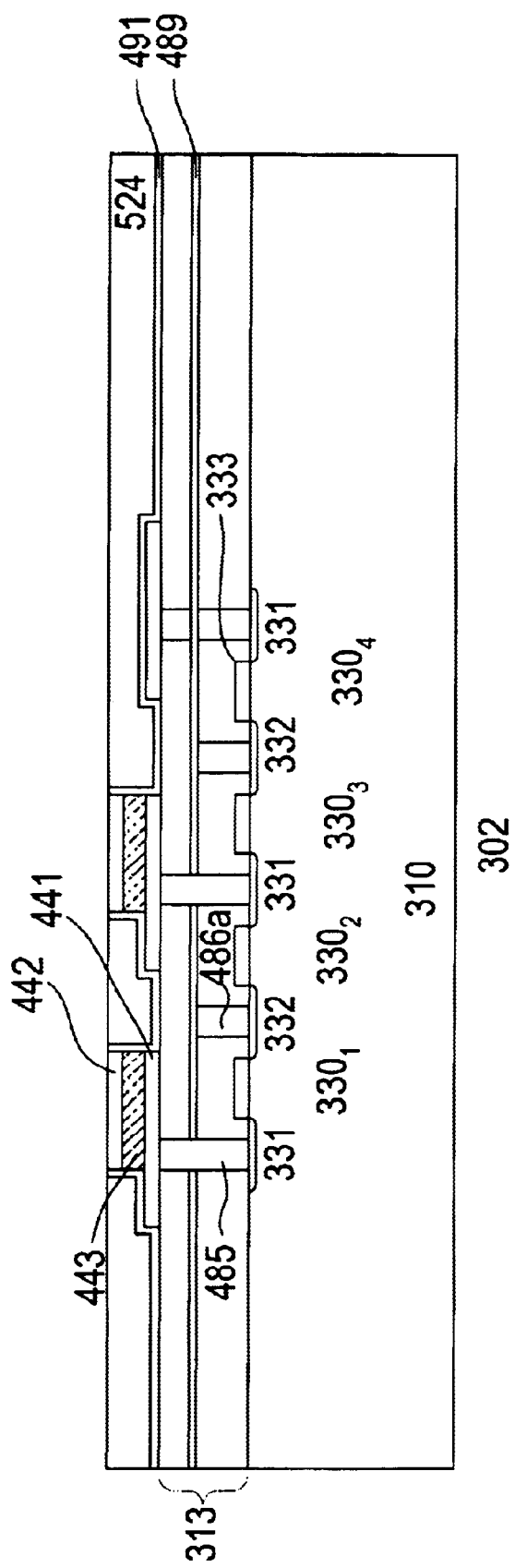

Referring to FIG. 5, a dielectric layer 524 is deposited on the substrate, covering the first capacitors. The substrate is then polished by, for example, chemical mechanical polish (CMP). The CMP removes excess dielectric material and the encapsulation layer above the common electrodes. This exposes the common electrodes.

Figure 6:
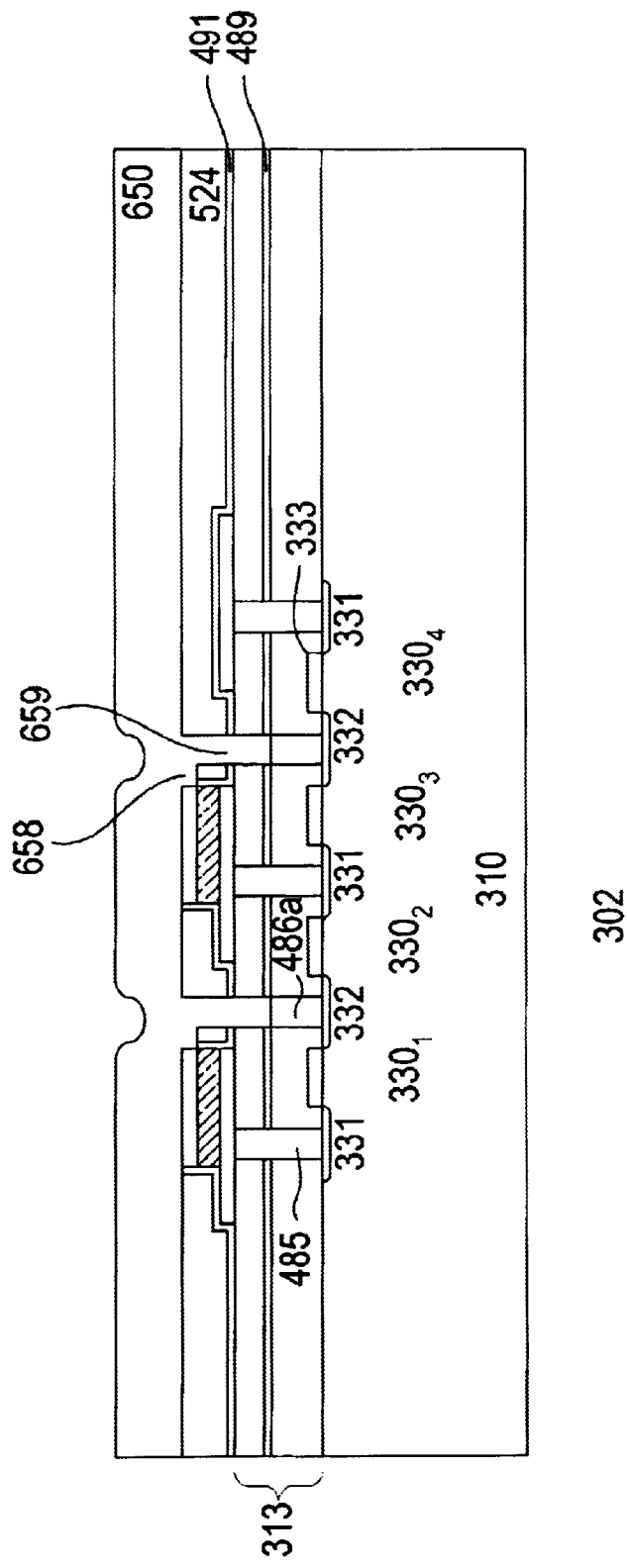

In FIG. 6, the substrate is patterned to form contact openings 659 to the lower portions of the AACE plugs. The contact openings serve to form the upper portions of the AACE plugs. Alternatively, for applications where the AACE plugs are formed in a single process, the openings are formed to expose the first diffusion regions of the transistors. Channels 658 are then formed in the dielectric layer in the upper portion of the openings 659. The channels are used to form the interconnections between the common electrodes to the AACE plugs. A conductive material 650 is deposited on the substrate, filling the contact openings and channels. The conductive material, for example, comprises tungsten. Other conductive materials are also useful.

Figure 7:
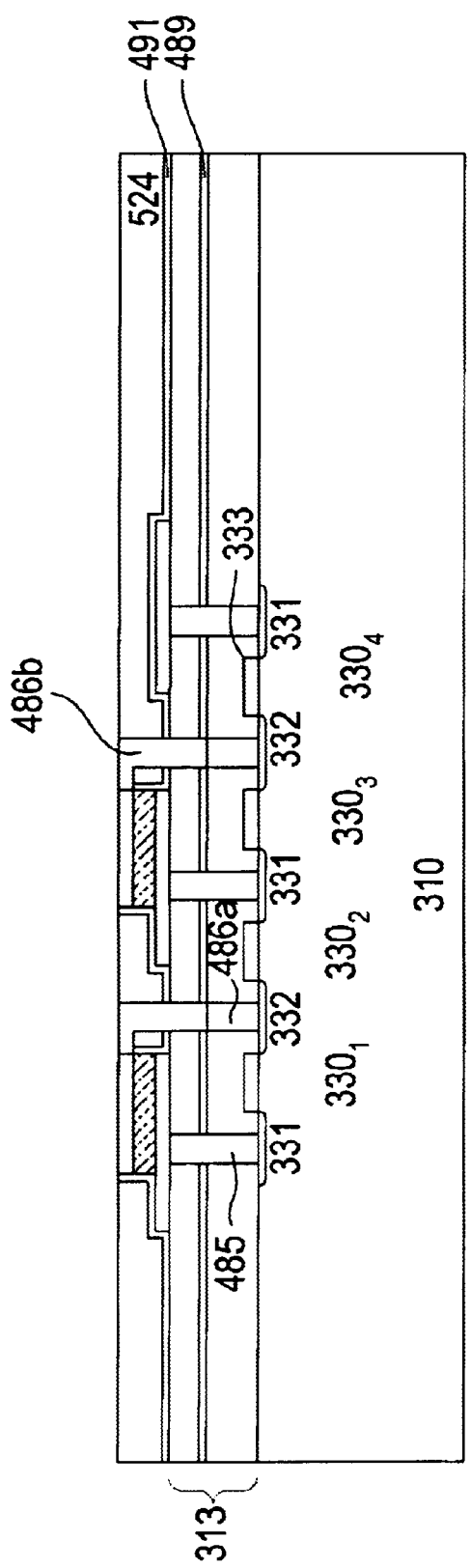

In FIG. 7, the substrate is polished, removing the excess conductive materials. In one embodiment, the polishing step forms the upper portion 486b of the AACE plugs and the interconnection to the common electrode of the capacitors.

Figure 8:
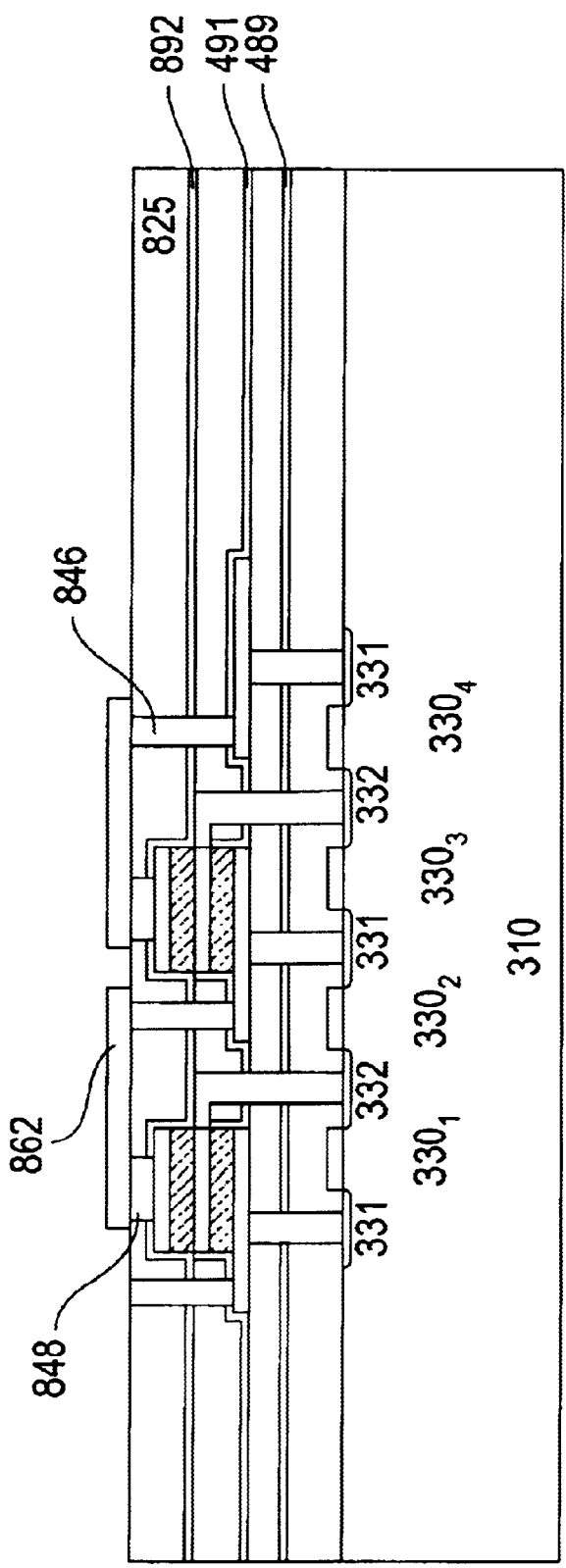

The process continues, as shown in FIG. 8, to form the second capacitor of the memory cell pairs. For example, ferroelectric and electrode layers are deposited. In one embodiment, the ferroelectric layer comprises PZT and the electrode layer comprises platinum. Other ferroelectric and electrode materials are also useful. The various layers are then patterned to form the second capacitors. An encapsulation layer 892, for example $Al_2O_3$, and a dielectric layer 825 are deposited on the substrate to cover the capacitors.

The process continues to form interconnections between the first electrodes of the first and second capacitors of the memory cell pairs. In one embodiment, TE plugs 848 and FCE plugs 846 are formed in the dielectric layer. The TE and the FCE plugs, for example, are formed using separate processes. Forming the plugs in the same process can also be useful. After the plugs are formed, a conductive layer 862 is deposited and pattern to form conductive strips to couple the TE and FCE plugs. The conductive layer, in one embodiment, comprises aluminum. Other conductive materials, such as tungsten, TiN, Ti, Cu, are also useful. Various conventional techniques can be used to form the contacts and conductive strips, for example, damascene, dual damascene, or RIE.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. An integrated circuit comprising:

a plurality of memory cells coupled in series to form a series group, the memory cells of a group are arranged in memory cell pairs, a memory cell pair of the group comprises;

a first memory cell having a first transistor having a gate and first and second diffusion regions and a first capacitor having first and second plates separated by a first capacitor dielectric;

a second memory cell having a second transistor having a gate and first and second diffusion regions and a second capacitor having first and second plates separated by second capacitor dielectric;

the second diffusion regions of the first and second transistors of the memory cell pair is a common second diffusion region;

the first and second capacitors are arranged in a stack in which the second plates of the capacitors is a common second plate;

the first plate of the first capacitor is coupled to the first diffusion region of the first transistor;

the first plate of the second capacitor is coupled to the first diffusion region of the second transistor; and the common second plate is coupled to the common second diffusion region.

2. The integrated circuit of claim 1 wherein the memory cells are ferroelectric memory cells in which the capacitor dielectrics comprise a ferroelectric material.

3. The integrated circuit of claim 2 wherein the first plate of the first capacitor is coupled to the first diffusion region of the first transistor via a bottom first plate plug.

4. The integrated circuit of claim 2 wherein the common second plate is coupled to the common second diffusion via an active common second plate plug which is isolated from the first capacitor dielectric and first plate of the first capacitor.

5. The integrated circuit of claim 4 wherein the first plate of the first capacitor is coupled to the first diffusion region of the first transistor via a bottom first plate plug.

6. The integrated circuit of claim 1 wherein the first plate of the first capacitor is coupled to the first diffusion region of the first transistor via a bottom first plate plug.

7. The integrated circuit of claim 1 wherein the common second plate is coupled to the common second diffusion via an active common second plate plug which is isolated from the first capacitor dielectric and first plate of the first capacitor.

8. The integrated circuit of claim 6 wherein the first plate of the first capacitor is coupled to the first diffusion region of the first transistor via a bottom first plate plug.

9. The integrated circuit of any one of claims 1–8 wherein first diffusion region of the second transistor of a first memory cell pair of adjacent memory cell pairs and the first diffusion region of the first transistor of a second memory cell pair of the adjacent memory cell pairs is a common first diffusion region of the adjacent memory cell pairs.

10. The integrated circuit of claim 9 wherein the first electrode of the second capacitor of the first adjacent memory cell pair is coupled to the first electrode of the first electrode of the first capacitor of the second adjacent memory cell pair and the common first diffusion region of the adjacent memory cell pairs.

* * * * *